(12) United States Patent
Koukab et al.

(10) Patent No.: US 7,902,929 B2
(45) Date of Patent: *Mar. 8, 2011

(54) ANALOGUE SELF-CALIBRATION METHOD AND APPARATUS FOR LOW NOISE, FAST AND WIDE-LOCKING RANGE PHASE LOCKED LOOP

(75) Inventors: Adil Koukab, Saint-Prex (CH); Michel Declercq, Penthaz (CH)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/355,948

(22) Filed: Jan. 19, 2009

(65) Prior Publication Data

US 2009/0128241 A1 May 21, 2009

Related U.S. Application Data

(63) Continuation of application No. 10/589,133, filed on Aug. 11, 2006, now Pat. No. 7,479,834.

(30) Foreign Application Priority Data

Feb. 13, 2004 (EP) .................................. 04100600

(51) Int. Cl.
*H03L 7/093* (2006.01)

(52) U.S. Cl. ................ 331/17; 331/34; 331/16; 327/156

(58) Field of Classification Search .................... 331/10, 331/14, 16, 17, 18, 25, 34, 179; 327/156, 327/157
See application file for complete search history.

(56) References Cited

U.S. PATENT DOCUMENTS

| | | | |
|---|---|---|---|
| 5,521,947 A | 5/1996 | Madsen | |
| 5,686,864 A | 11/1997 | Martin et al. | |
| 5,942,949 A | 8/1999 | Wilson et al. | |
| 6,496,075 B2 | 12/2002 | Justice et al. | |
| 6,525,609 B1 | 2/2003 | Behzad | |
| 6,563,392 B2 * | 5/2003 | Gomez et al. | 331/117 FE |
| 6,574,288 B1 | 6/2003 | Welland et al. | |
| 6,747,521 B1 | 6/2004 | Allott | |
| 6,759,912 B2 | 7/2004 | Yamagishi et al. | |
| 6,788,160 B2 | 9/2004 | Keller | |
| 6,882,230 B2 | 4/2005 | Iadanza et al. | |
| 7,479,834 B2 * | 1/2009 | Koukab et al. | 331/16 |

* cited by examiner

*Primary Examiner* — Robert Pascal
*Assistant Examiner* — Ryan Johnson

(57) ABSTRACT

A method of operating a phase lock loop includes generating a control voltage based on both an output signal of a voltage-controlled oscillator and a reference signal. An operating mode is selected from one of a high-gain mode, a zero-gain mode and a low-gain mode based on the control voltage. The phase lock loop is operated in the selected one of the high-gain mode, the zero-gain mode, and the low-gain mode. The control voltage is offset to generate an offset voltage based on the selected operating mode. The output signal is generated based on the offset voltage.

17 Claims, 6 Drawing Sheets

ANALOGUE SELF-CALIBRATION METHOD AND APPARATUS FOR LOW NOISE, FAST AND WIDE-LOCKING RANGE PHASE LOCKED LOOP

CROSS-REFERENCE TO RELATED APPLICATIONS

This application is a continuation of U.S. patent application Ser. No. 10/589,133 filed Aug. 11, 2006 now U.S. Pat. No. 7,479,834. This application is a National Stage of International Application No. PCT/EP05/50484, filed Feb. 4, 2005. The disclosures of the above applications are incorporated herein by reference in their entirety.

BACKGROUND OF THE INVENTION

1. Field of the Invention

The present invention relates to a phase lock loop (PLL) circuit having a variable output frequency. More particularly, the present invention consists of an improved method for a fast and automatic setting of the output frequency of PLL synthesizers that overcomes the classical problems associated with prior implementations, concerning: linearity, locking range limitation, settling time, jitter, phase noise, and spectral purity deterioration.

2. Description of the Prior Art

A PLL synthesizer is a circuit used to generate a periodic signal with a precise frequency. This kind of circuit is widely used in many communication and measurement products. Its applications include advanced digital systems, such as microprocessors and micro-controllers. The PLL circuits should be designed with stringent constraints in terms of noise performance, settling time, power consumption, locking range, integration, cost, etc.

Typically PLLs include: a phase detector that compares the phase of the reference signal to the phase of an internal feedback signal; a charge pump and a low pass loop filter for setting an analogue voltage proportional to the detected phase difference; a voltage-controlled oscillator (VCO) that generates a periodic output signal with a frequency proportional to its input voltage; and a frequency divider that generates the feedback signal after dividing the frequency of the output signal by a predefined integer or fractional number (N).

Two seemingly contradictory requirements constitute the fundamental forces driving the design of VCOs. On one hand, a wide frequency tuning range and thus a high VCO gain are needed to compensate temperature and process variations and to cover the frequency band of the considered application. At the same time, the gain of the VCO should be as small as possible to meet phase noise and spectral purity specifications. In fact, the higher the gain of a VCO, the more its sensitivity to the noise in its control path increases. The VCO control path is in general affected by several noise sources that include: charge pump noise, filter noise and ripple due to mismatching between the charge pump up and down currents. The noise in the signal path generated by the active elements of the VCO is also dramatically amplified and converted to the phase noise if the VCO gain is high.

Some approaches for simultaneously reducing the VCO gain and enabling a wide frequency range were recently presented as for example in U.S. Pat. No. 5,942,949, U.S. Pat. No. 6,574,288 and U.S. Pub. No. 2003/0119467. All these solutions consist in breaking the wide range tuning curve into several narrower-range sections with some frequency overlap. A digital calibration of a switched-capacitor network is used to choose the appropriate narrow-range section before starting an analogue fine frequency tuning over this curve.

Additional blocks are needed to build a second loop, which achieves the digital self-calibration of the VCO. The second loop is generally constituted by a phase/frequency detector, a charge pump followed by a capacitor or a digital accumulator, and a state machine that applies a sequence of digital control input values to the VCO. The complexity of those extra blocks increases proportionally to the needed accuracy of the output frequency. Moreover, since the consecutive digital control words (e.g. 11110 and 00001) can use totally different units of the switched capacitor network, the accumulated capacitance errors due to process variation can reach very high values. Therefore, a very high frequency overlap is required to compensate these errors, leading to a higher gain of the VCO, a lower total tuning range, and a higher parasitic capacitance. This is why digital calibration can result in prolonged design cycles with a significant additional area and increased system costs.

This digital self-calibration is in general implemented with a simple algorithm such as sequential search as well as with more complex ones such as binary search. However, the time needed for those searching algorithms to achieve a fine resolution is often so high that only a coarse tuning or a self-calibration during the power up of the system is possible. Many side effects can affect the PLL output frequency during its on-mode such as temperature variation, power supply fluctuation, injection pulling etc. Therefore if the frequency varies significantly during the on-mode of the system, the PLL is not able to correct this variation within a reasonable time. Moreover, the PLL settling time is one of the most important criteria for many applications. It is even the most critical figure for systems dedicated to fast frequency-hopped spread-spectrum, Ultra-Wideband, data recovery or time-multiplexed transceivers. Therefore, already at the top-level system design it would be desirable to avoid the classical scheme, where a digital calibration for the first course tuning of the frequency is used, followed by a continuous tuning for the final fine adjustment of the frequency. This classical scheme constitutes the basis of the methods described in U.S. Pat. No. 6,574,288 and U.S. Pub. No. 2003/0119467. For the fine continuous tuning a reverse-biased diode, nMOS or pMOS varactor are typically used. However an integrated circuit is disclosed in U.S. Pat. No. 6,574,288 and U.S. Pub. No. 2003/0119467 enabling to avoid the use of these traditional varactors during the fine-tuning stage. In this circuit, capacitors with fixed values are used in an implementation where each capacitor is linked to a variable impedance device. The variable impedance devices are transistors having their gate controlled by a plurality of analogue signals. The equivalent capacitance of the circuit is indirectly varied by varying the impedance of the variable impedance devices. To avoid the abrupt nonlinear variation of the impedances an offset voltage is introduced between the control analogue signals. However, if a fast and fine resolution self-calibration technique is available, it enables operation very close to the desired frequency. In this way the use of the noisy and cumbersome variable impedance devices, capacitors and their control circuitry can be avoided, and only a small varactor (pn junction, nMOS or pMOS) is sufficient to achieve the final fine-tuning. Moreover, the gain of the VCO is at its minimum during the operation of the system and the noise performance is significantly improved.

SUMMARY OF THE INVENTION

The aim of the present Invention is to provide a method and apparatus for a fast and automatic setting of the phase locked loop (PLL) output frequency over a wide tuning range, with a very low VCO gain during an in-lock state to improve noise performance, and without using costly, complex and time consuming digital self-calibration techniques.

This aim is achieved with a method for analogue self calibrating of a phase locked loop circuit comprising a phase frequency detector, a charge pump, a loop filter, a voltage controlled oscillator including a plurality of VCO tuned elements. An output signal is compared with a reference signal frequency entering the phase frequency detector and characterized in that, the voltage controlled oscillator operating mode, using a linearized frequency versus voltage curve, is switched, in a first frequency tuning operation enabling a wide locking range, to a linear-high-gain (LHG) mode. After locking to the appropriate frequency with the first tuning operation, the voltage controlled oscillator operating mode is automatically switched to a zero-gain (ZG) mode while keeping the frequency of the voltage controlled oscillator unchanged.

The sensitivity of the voltage controlled oscillator to the noise in the control path is then practically eliminated and the phase noise performances significantly improved, and optionally, after the ZG mode, the voltage controlled oscillator operating mode is switched to a low-gain (LG) mode enabling a fine tuning of the frequency by the phase locked loop for compensating small residual frequency errors and temperature variations.

The present invention concerns also an integrated circuit comprising a phase locked loop circuit including: a phase or frequency detector that compares the phase and frequency of a reference signal to the phase and frequency of an internal feedback signal and generates output error signals; a charge pump that generates amounts of charges proportional to the output error signals; a loop filter for setting an analogue voltage proportional to the charges accumulated in their capacitors; a voltage-controlled oscillator with multiples inputs corresponding each to a VCO tuned element characterized in that the phase locked loop circuit includes a gain mode switcher circuit connected between the loop filter output and the voltage-controlled oscillator inputs; enabling the voltage-controlled oscillator to work successively in a LHG mode and a ZG mode. The gain mode switcher includes offsets generators circuits, a switch configuration and comparators. The offsets generators generate the voltages after shifting the loop filter output voltage with predefined offsets. The switch configuration applies the voltages of the offset generators to the inputs of the voltage-controlled oscillator during the LHG mode, isolates the inputs of the voltage-controlled oscillator from the offset generators and applies the output voltages of the offsets generators to the inputs of the comparators during the transition to ZG mode, applies the resulting output voltages of the comparators to the inputs of the voltage-controlled oscillator, and finally freezes the state of each comparator and thus the frequency of the voltage-controlled oscillator making it independent of the loop filter output voltage, which constitute the ZG mode.

A VCO tuned element corresponds to a varactor (voltage controlled capacitor), to a voltage controlled current source VCI or to any other voltage controlled component varying the frequency of the VCO. A set of these elements respectively constitutes a voltage-controlled oscillator VCO provided with several inputs as described below.

In general, the present invention is a PLL-based frequency synthesizer having a reconfigurable VCO with three modes of operation: a LHG mode, a ZG mode, and a LG mode. During a first tuning operation, a gain-mode switcher sets the VCO in the LHG mode, enabling wide-locking range of the synthesizer with a fast settling time. During this operation, the control voltage of the VCO is varied by the PLL until the appropriate output frequency is found.

When the loop is locked, the VCO is automatically switched to the ZG mode by the gain-mode switcher, while keeping the frequency of its output signal practically constant. Its sensitivity to the noise in the control path is then practically eliminated and its phase noise performance is significantly improved. If the frequency error is sufficiently small for the considered application, the tuning is stopped at this stage. If the error is not sufficiently small, the VCO is switched again to the LG mode and fine-tuning adjustment of the output frequency is achieved.

Another embodiment of the present invention is a method and apparatus for providing a linear variation of the frequency over all the voltage tuning range. The application of this method is particularly important during the LHG mode, where the VCO gain variation may leads to serious degradation of the loop stability margin and the noise performance.

The present invention is not limited to charge-pump PLLs. As long as the circuit has a tuning system using a variable capacitance or a variable current, the reconfigurable three-mode (LHG mode, ZG mode, and eventually LG mode) varactor (voltage controlled capacitor) or controlled current source using a gain-mode switcher in accordance with the present invention, can be used for setting the desired value of the capacitance or the current.

BRIEF DESCRIPTION OF THE DRAWINGS

It is noted that the appended drawings illustrate only exemplary embodiments of the invention and are, therefore, not considered limiting of its scope.

DETAILED DESCRIPTION

Figure 1:
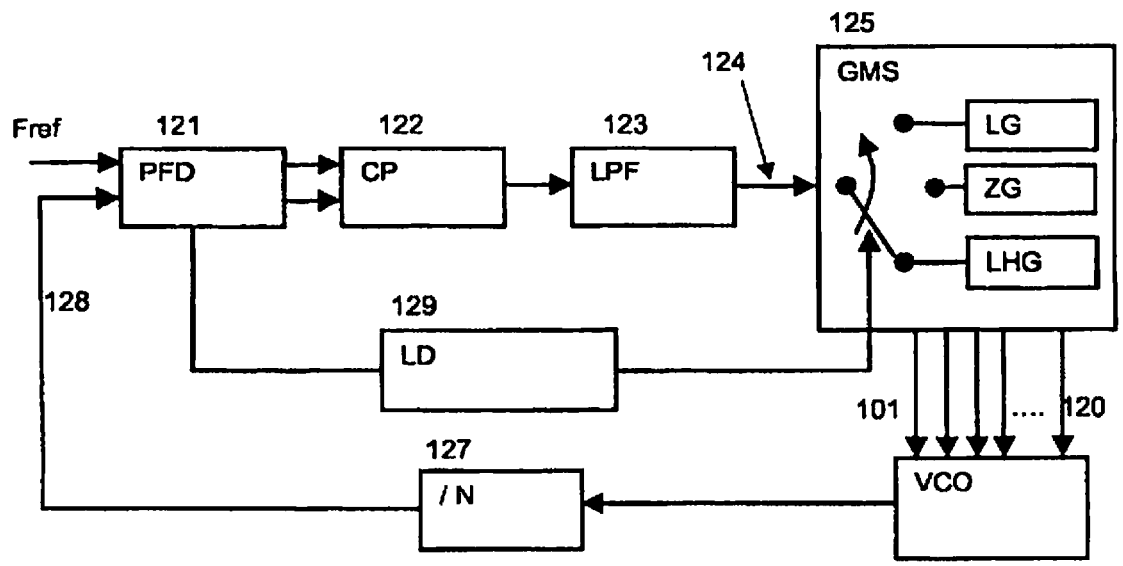
FIG. 1 illustrates a block diagram of a charge-pump phase locked loop system in accordance with the present invention.

FIG. 1 is a functional block diagram of the charge pump phase locked loop (PLL) system in accordance with the present invention. The PLL circuit, generally designated 100, includes a phase/frequency detector (PFD) 121 to compare the phase and the frequency of the reference signal (Fref) to the phase and the frequency of the feedback signal 128, and generates an error signal. The error signal is either an up signal or a down signal depending on the sign of the detected error.

Charge pump CP 122 generates an amount of charge equivalent to the error signal provided by the PFD 121. Depending upon the polarity of the signal (up or down), the charge is either added to or subtracted from a capacitor in a low pass filter (LPF) 123. Accordingly, the LPF 123 generates a control signal 124 that has a control voltage $V_t$ and is applied to the input of a gain-mode switcher (GMS) 125.

Figure 2:
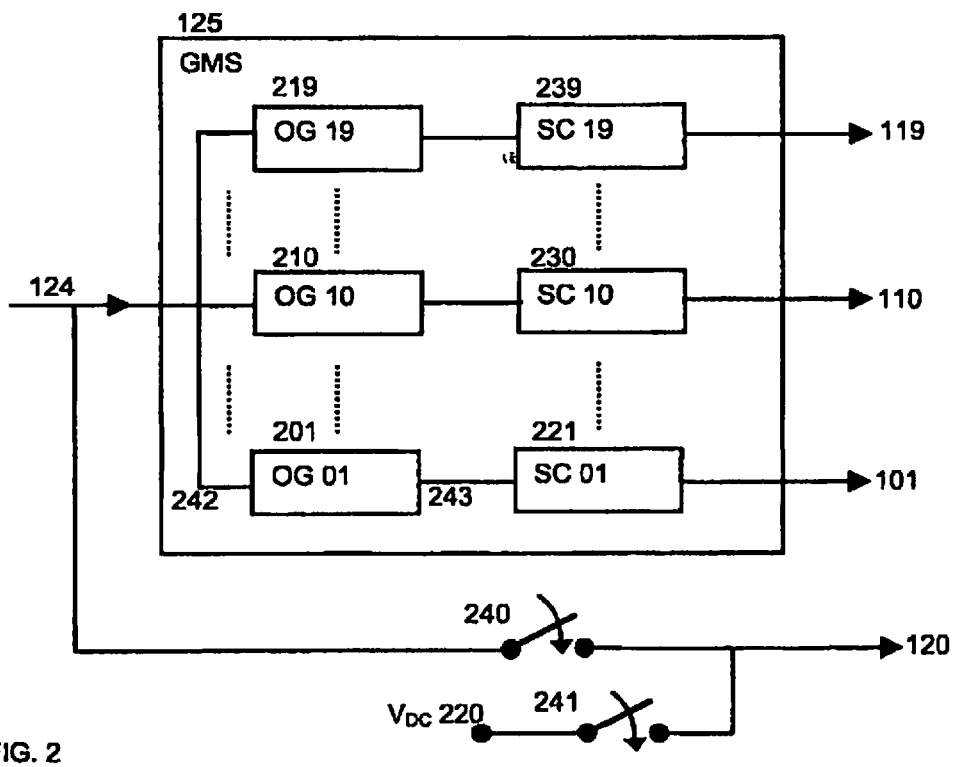
FIG. 2 diagrammatically shows the gain-mode switcher incorporated into the PLL of FIG. 1.

The GMS 125 is the block of the PLL 100 that changes the gain mode of the VCO 128 during the tuning operations. Three operation modes are possible: A linear-high-gain (LHG) mode, a zero-gain (ZG) mode, and a low-gain (LG) mode. The GMS 125 is composed of N parallel paths. N is equal to 19 in the exemplary GMS embodiment of FIG. 2. Each path includes an offset generator (OG) (e.g., 201) and a switcher-comparator (SC) (e.g., 221).

Figure 3:
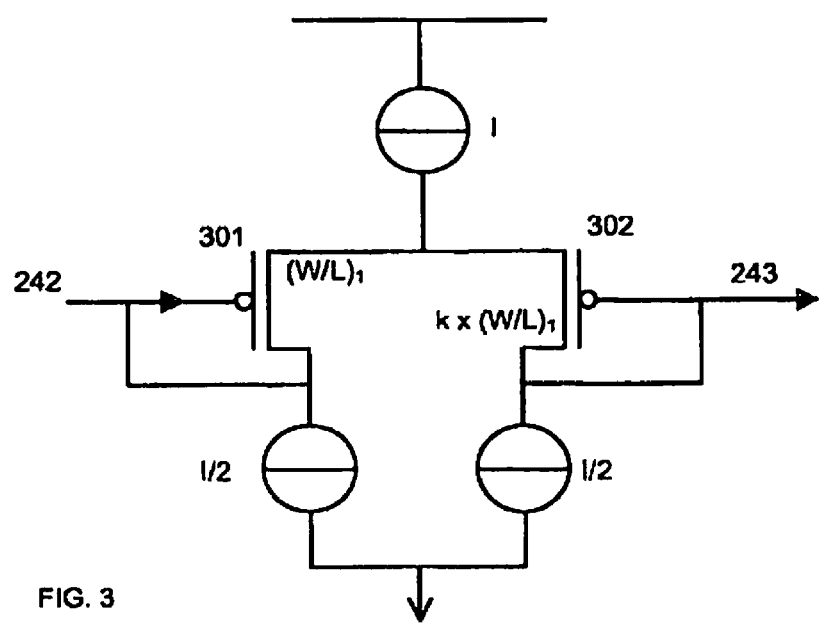
FIG. 3 diagrammatically shows an exemplary implementation of an offset-generator unit (e.g. 201) of the gain-mode switcher of FIG. 2.

Each OG (e.g., 201) receives the control voltage $V_t$ at its input and generates an output voltage with an added offset that is $V_t + \Delta V$ (e.g., 243). The values of the generated offsets is varied from one OG to the other by varying the dimensions of their components. FIG. 3 illustrates an exemplary embodiment of the OG incorporated in the GMS 125. The dimensions $(W/L)_1$ and $(W/L)_2$ of translators 301 and 302 are chosen in such way that $(W/L)_2$ is equal to $k \times (W/L)_1$. By changing the value of k, one can change the value of the offset $\Delta V$. The parameter k is chosen either higher than 1 or lower than 1. The OGs with k higher than 1 will generate a positive offset and those with k lower than 1 generate a negative offset. The output voltage of each OG (e.g., 201) is applied to a SC (e.g., 221).

Figure 4:
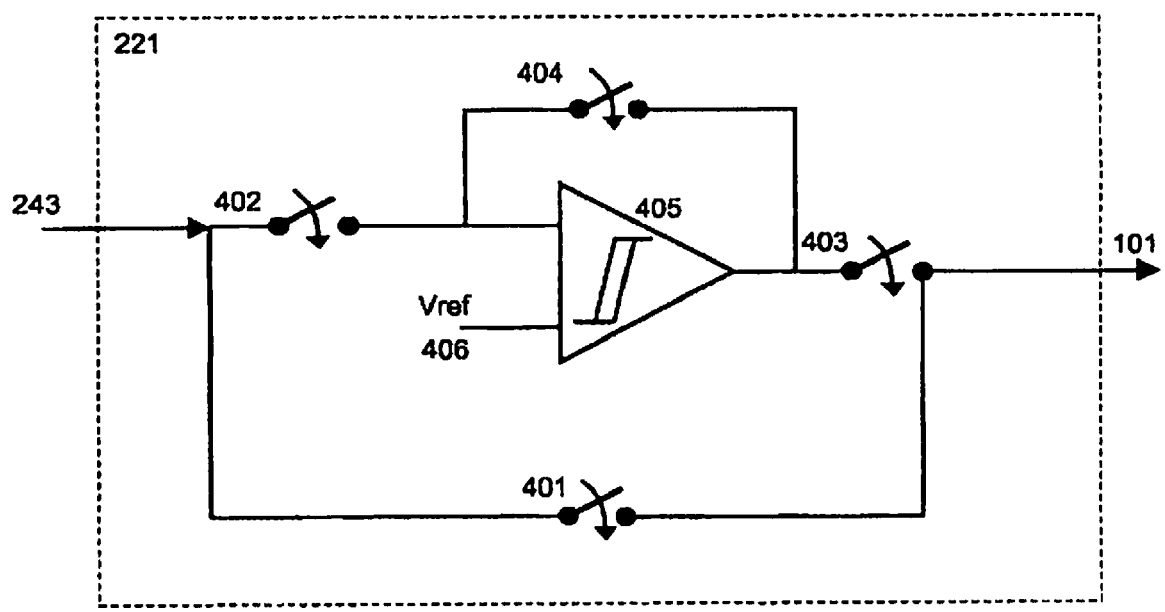
FIG. 4 diagrammatically shows an exemplary implementation of a switcher-comparator unit (e.g. 221) of the gain-mode switcher of FIG. 2.

FIG. 4 shows an exemplary embodiment of a SC unit of the GMS 125. In the first tuning, the PLL is started in the LHG mode, each SC (e.g., 221) of the GMS 125 applies its input voltage $V_t + \Delta V$ (e.g., 243) directly to one of the inputs of the VCO (e.g., 101). After a first locking, the input voltage $V_t + \Delta V$ of each SC (e.g., 405) is compared to a reference voltage (Vref) 406, and its output is switched to zero or to the power supply voltage Vcc depending upon whether $V_t + \Delta V$ is higher or lower than the Vref 406. In this example, the Vref 406 corresponds to the middle of the capacitance versus voltage characteristic of the used varactors (among 501 to 519). The capacitance of these varactors is thus switched to its maximum Cmax or to its minimum Cmin, depending upon whether its value was at Cmax or at Cmin when the PLL was locked at the end of the LHG mode. By this operation, the mode is switched to the ZG mode while keeping the total capacitance and so the output frequency unchanged.

The present invention can be applied on two types of PLL configurations.

The first configuration includes a PLL with a capacitance controlled VCO, such as inductance-capacitance LC oscillator, which is driven by a voltage varying a set of capacitances (varactors). This PLL is often used in radio-frequency (RF) applications for large frequency ranges. The main advantage of LC VCO is its low phase noise.

Figure 5:
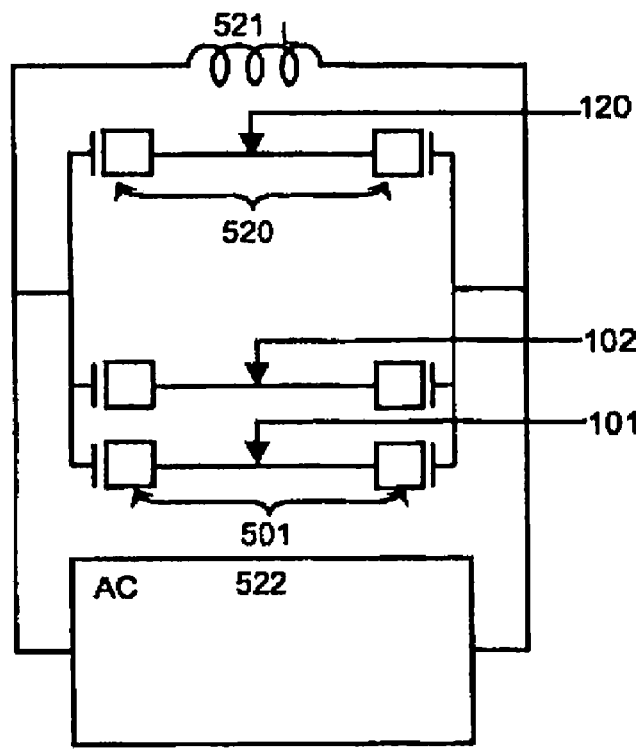
FIG. 5 illustrates an exemplary embodiment of a multi-inputs-VCO and their controlled elements In accordance with the present invention and which can be incorporated in the PLL of FIG. 1.

FIG. 5 shows an example of the multi-input VCO incorporated in FIG. 1. This schematic is an embodiment of a modified inductance L-capacitance C VCO (LC VCO), which has several variable capacitors (e.g., 501 to 520 in FIG. 5). The values of these capacitors 501 to 520 are controlled by input voltages 101-120 supplied by the GMS 125. The output frequency of the VCO depends on both the value of the inductance 521 and the value of the capacitors 501 to 520. The active circuit AC 522 generates the required negative impedance for the circuit to oscillate.

The second configuration includes a ring oscillator PLL, which is driven by a voltage varying a set of current sources. This PLL is preferably used in digital applications and/or at low frequency ranges. The main advantage is this type of PLL is its compactness and wide tuning range performance.

Figure 6:
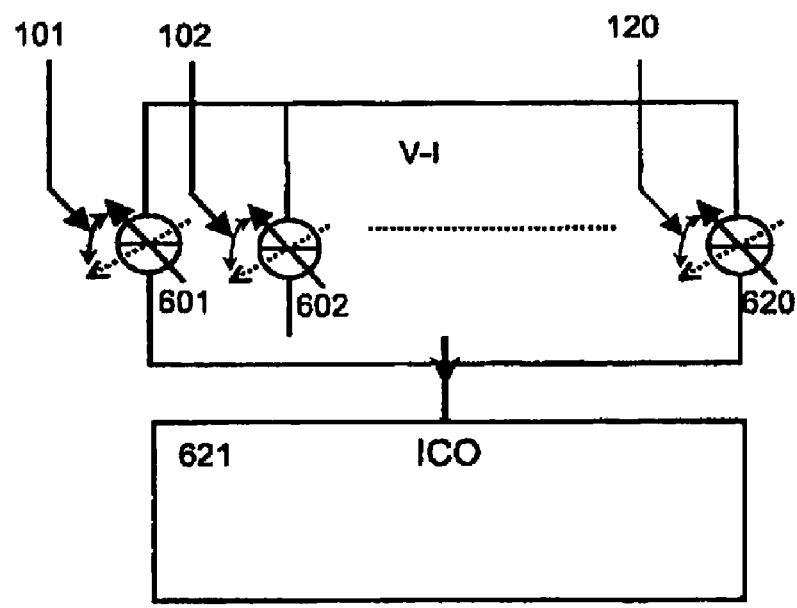
FIG. 6 Illustrates another exemplary embodiment of a multi-inputs-VCO and their controlled elements in accordance with the present invention and which can be incorporated in the PLL of FIG. 1.

FIG. 6 shows an example of VCO using voltage controlled current sources (VCIs) that can be incorporated in FIG. 1 to replace the LC VCO as shown in FIG. 5. The voltage controlled oscillator VCO is made by a current controlled oscillator ICO preceded by voltage-current V-I converters at each input. The values of the currents 601 to 620 generated by the converters are controlled by input voltages 101-120 supplied by the GMS 125. The output frequency of the oscillator depends then on the values of the currents 601 to 620. The ring oscillator 621 can be implemented with a cascade of differential buffer delay stages as well as with an odd number of inverters.

Figure 7:
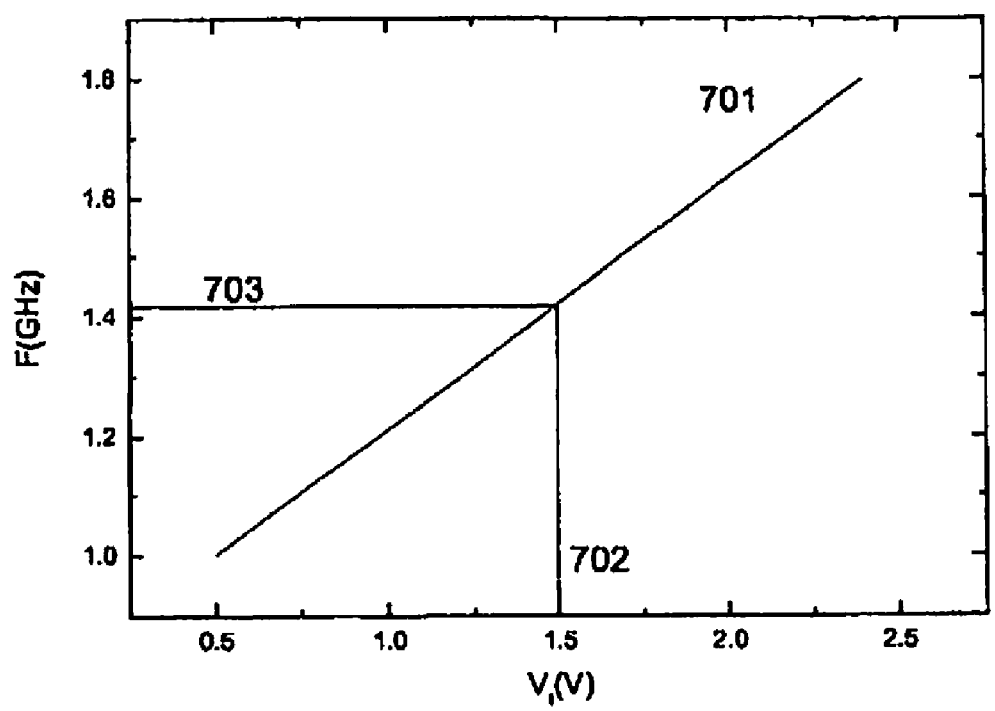
FIG. 7 shows a hypothetical frequency versus voltage characteristic needed for the considered application.

The present invention is clarified with the help of the hypothetical application illustrated in FIG. 7. PLLs are often designed for a wide range of frequencies. The wide frequency tuning range is needed to compensate temperature and process variation and to cover the frequency band of the considered application. In the case of the application illustrated in FIG. 7, a frequency tuning range of 800 MHz is needed. The PLL should be able to set any frequency in the band 1 GHZ to 1.8 GHz. The available tuning voltage is about 2 V (i.e., from 0.5 V to 2.5 V), thus, the needed VCO gain ($K_{vco}$) is 400 MHz/V. It is well known that the operating curves (i.e., input voltage versus output frequency) of classical VCOs are in general highly non-linear. A variation of the gain $K_{vco}$ changes the open-loop gain and hence change the loop bandwidth and phase margin. This is why in this hypothetical application of FIG. 7 a linear operating curve with a constant $K_{vco}$ is targeted.

Figure 8:
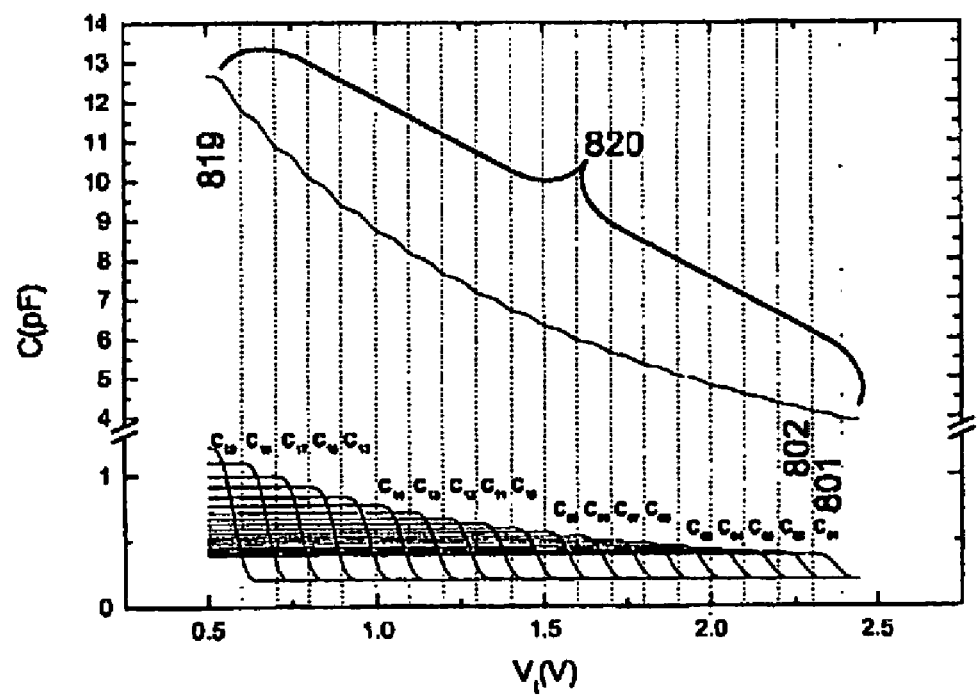
FIG. 8 the curve 820 shows a hypothetical capacitance versus voltage characteristic needed for the considered application, and C01 to C19 curves show the capacitance versus voltage curves used to build the curve 1.

The curve 820 of FIG. 8 illustrates the needed capacitance versus voltage characteristic of the VCO varactor to produce the operating curve 701. The curve 820 is deduced from 701 by using the well-known formula $2\pi F = (LC)^{-1/2}$, where F is the frequency of the VCO output signal, and L and C are respectively the equivalent parallel inductance (521) and capacitance (501-520) of the tank. To simplify the analysis, the fixed capacitance of the VCO is supposed to be negligible and its inductance 521 constant and equal to 2 nH. To build the wide-range curve 820, we start by breaking it into several narrower-range sections, 801 to 819. Each narrower-range section (e.g., 801) is represented by an individual curve (e.g., $C_{01}$,) having the same variation over the corresponding voltage interval (e.g., 0.1V in FIG. 8). As a result, the curve 820 can be reconstituted entirely by a simple addition of the individual curves $C_{01}$, to $C_{19}$. Each one of the curves $C_{01}$, to $C_{19}$ corresponds to a given varactor among the varactors 501 to 519 of FIG. 5.

Figure 9:
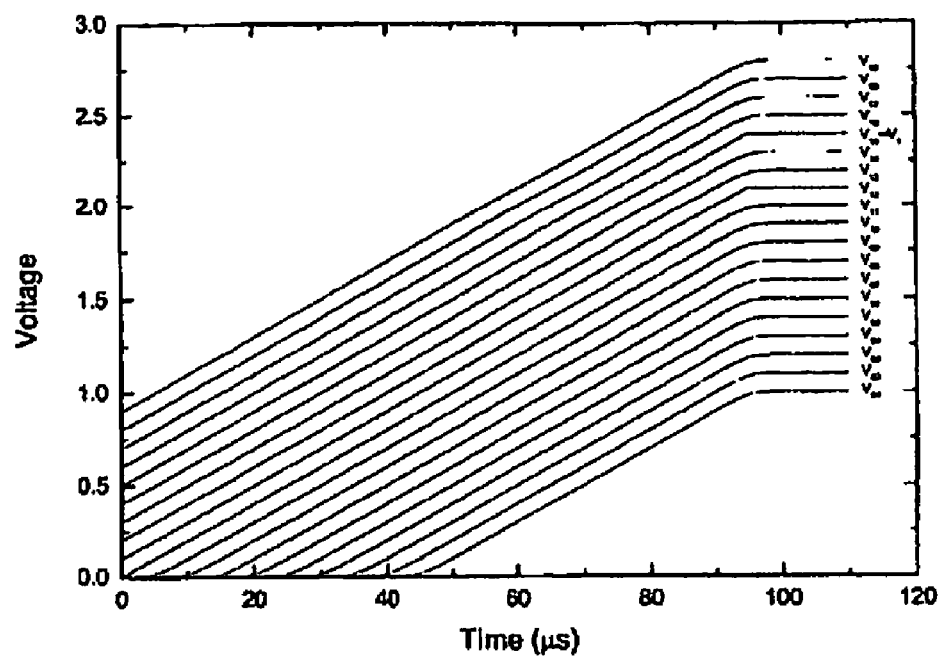
FIG. 9 curves V01 to V19 illustrate the output voltages of the offset generators implemented in the gain-mode switcher of FIG. 2. These output voltages are applied to the capacitors units 501 to 519 of the multi-inputs-VCO of FIG. 5.
Figure 10:
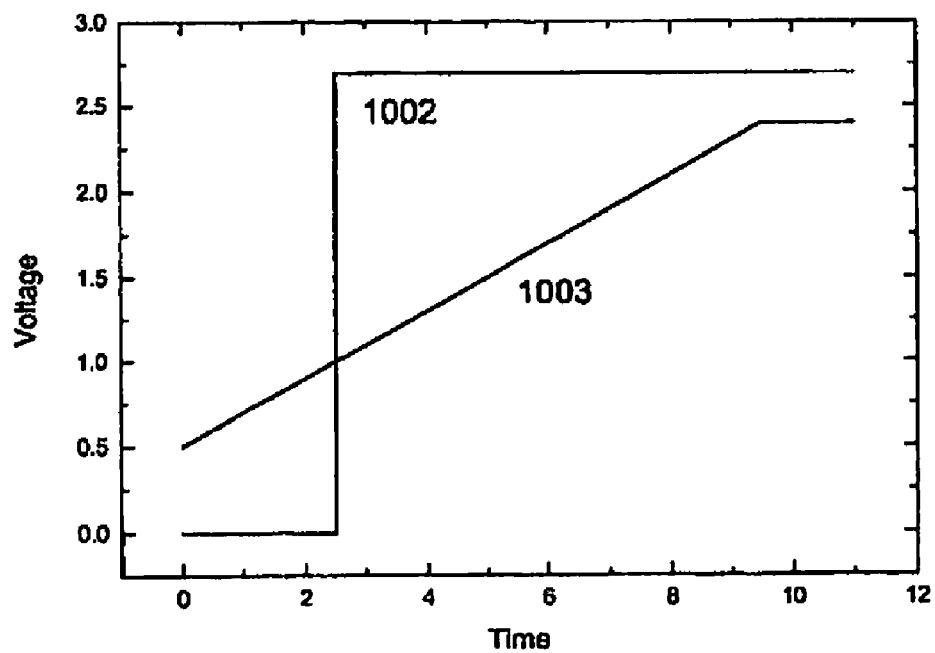
FIG. 10 illustrates the input 1003 and output 1002 voltage of the comparator 405 illustrated in FIG. 4.
Figure 11:
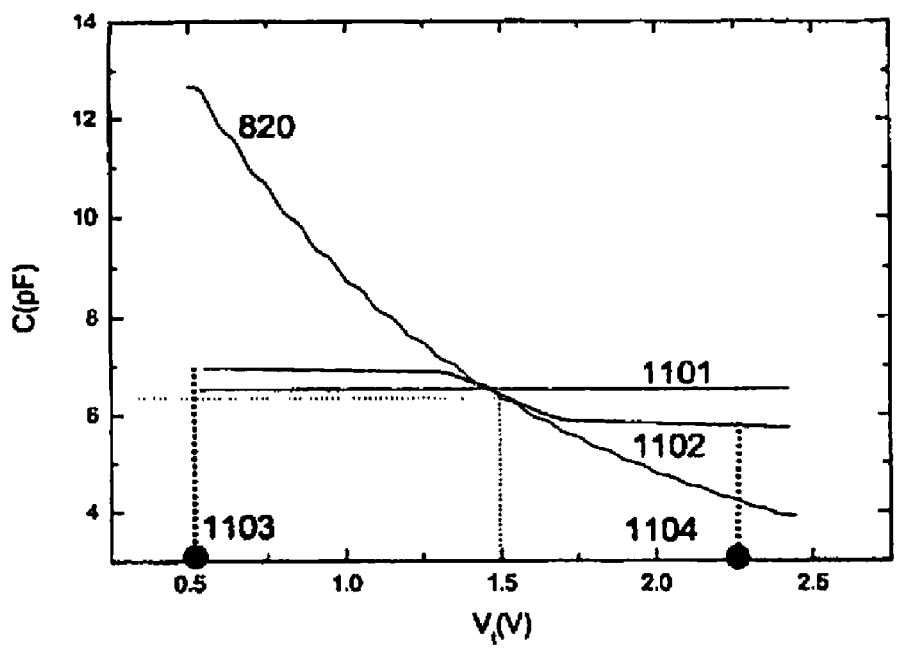
FIG. 11 illustrates the capacitance versus control voltage characteristics of the VCO, during a LHG mode curve 820, ZG mode curve 1101, and LG mode curve 1102.

The exemplary varactors 501 to 519 are MOS (Metal Oxide Semi-conductor) transistors, dimensioned in such way that their capacitance characteristics have respectively the same variation of $C_{01}$, to $C_{19}$. In the exemplary embodiments of FIG. 5 the control voltage 124 is applied to the MOS capacitors 515 and generates the operating curve $C_{15}$. To generate the other operating curves $C_{15,i}$, that is $C_{01}$ to $C_{15}$ curves, a tuning voltage with various offsets are applied to the corresponding MOS capacitors. More precisely, to generate the curve $C_{15,i}$, a voltage $V_{15,i}=V_t\pm0.1\times i$ is applied to the corresponding MOS capacitor. This voltage is one among the voltages $V_{01}$ to $V_{19}$ illustrated in FIG. 9, which illustrate the output voltages of the offset generators implemented in the GMS 125 of FIG. 2. Therefore, when those output voltages are directly applied to the MOS capacitors 501 to 519 of the multi-inputs VCO of FIG. 5, the PLL works in the LHG mode and the resulting frequency versus tuning voltage curve is exactly the desired curve 701 of FIG. 7.

Figure 12:
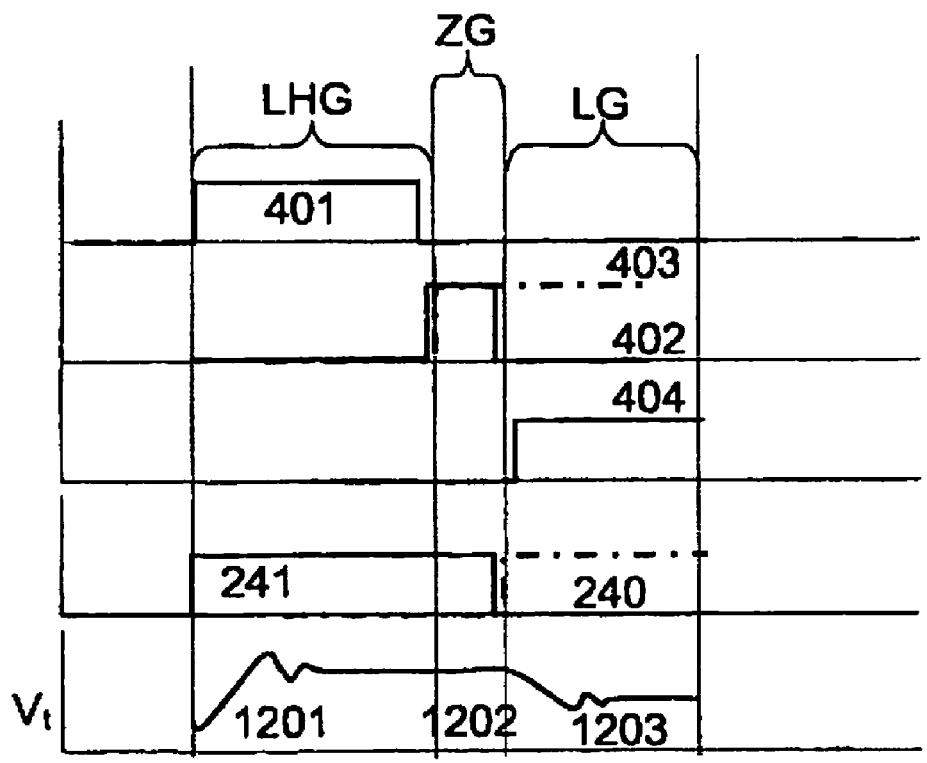
FIG. 12 diagrammatically shows the pattern of some internal signals of the PLL system of FIG. 1, and exemplary variations of control voltage (1201, 1202, 1203) during the loop settlings.

FIG. 12 diagrammatically shows the pattern of some internal signals of the PLL system 100, and exemplary variations of control voltage during the three modes of operation.

During a first tuning operation, the GMS 125 sets the multi-input VCO 126 in the LHG mode 1201. During this operation, switch 240 is open and 241 closed. Accordingly, the constant voltage $V_{dc}$ 220, is provided to varactor 520, freezing its capacitance in the middle of its capacitance versus voltage characteristic. On the other hand, switch 401 of each SC (among 221-239) of the GMS is closed while 402, 403, 404 are open. Accordingly, the outputs voltages of the OG 201-219 are directly provided to varactors 501 to 519. The phase frequency detector PFD 121 and the charge pump CP 122 vary the control voltage of the control signal 124 and thus, through the OG 201-219, also vary the voltages 101-119 according to the curves $V_{01}$-$V_{19}$ of FIG. 9. During this tuning operation, the frequency is varied according to the wide-range curve 701 until the appropriate value is found. In the given example the control voltage $V_t$ is set to 1.5V (702) and output frequency of the control signal 124 is set to 1.42 GHz (703). The noise performance of the PLL is not critical at this stage. Therefore, in this mode the PLL can be optimized to be stable and have a fast settling time even if it is at the cost of more noise. For this, a fraction of the finer capacitances is optionally switched off and the current of the charge pump is increased.

The duration of the LHG mode 1201 is controlled by a lock detector (LD) 129. This mode is selected during a sufficiently long time for the loop to lock. When the control voltage $V_t$ converges to the needed value (e.g., 1.5 V 702), the LD 129 sends a signal to the GMS 125 and the VCO 126 is switched to a ZG mode (ZG mode in FIG. 12) by the GMS 125, while keeping its frequency constant.

During the ZG mode 1202 step, the switch 401 of each SC among 221 to 239 is open, isolating the varactors 501-519 from the output voltages $V_{01}$-$V_{19}$ of OGs 201-219. At the same time, the switches 403 and 402 are closed. The voltages $V_{01}$-$V_{19}$ are thus compared to the Vref 406 by the SC 405. The Vref 406 is chosen to correspond to the middle of the capacitance versus voltage characteristic C15 of FIG. 8, which corresponds to varactor 515 (e.g., a Vref>>0.95 V). The output of the SC 405 is then switched to zero or to Vcc depending upon whether the input voltage is higher or lower than the Vref 406. Accordingly, the capacitance of the varactors 501-519 is switched to its maximum value or to its minimum value. To freeze the situation and to make it independent on future variations of the control voltage $V_t$, the switch 402 is opened and the switch 404 is closed. The capacitance of the varactors 501-519 are thus frozen and correspond to a constant capacitance (e.g., operating curve 1101), which is independent of the control voltage $V_t$. The sensitivity to the noise in the control path is then practically eliminated and the phase noise performance of the PLL 100 is significantly improved. At this stage, the equivalent output frequency of the VCO is equal to the desired frequency (e.g., 1.42 GHz 703) with a small error. The error can be reduced by increasing the number of fractions in FIG. 8 and thus increasing the number of VCO varactors in FIG. 5. If the frequency error is sufficiently small for the considered application the tuning is stopped.

If the error is not sufficiently small the VCO is switched to a LG mode 1203. Switch 241 is opened and switch 240 is closed. The control (tuning) voltage $V_t$ is then applied to an additional varactor 520, and fine-tuning adjustment over operating curve 1102 is achieved.

Optionally, comparators are added to the GMS 125 to set an upper and a lower limit for its control (input) signal 124. Accordingly, these comparators control the value of the signal 124. If during the LG mode 1203, this signal reaches either of the upper limit 1104 or the lower limit 1103, a Gain-Mode Switcher (GMS) 125 is restarted, and a LHG mode 1201 is selected again. The limits are preferably set near Vcc for the upper (1104) and near zero for the lower (1103). This operation is useful if the fine-tuning range is not sufficiently wide to compensate frequency variation that can arise during the LG mode 1203. This frequency variation can be caused by a rise in the chip temperature for instance.

To preserve the stability of the PLL in both the LHG mode 1201 and the LG mode 1203, the product of the charge pump CP 122 current and the gain of the VCO 128 is kept constant. Therefore, a fraction of the charge pump CP current is switched off during the LHG mode 1201 and switched on during the LG mode 1203. Optionally, a fraction of the filter capacitance is switched off during the LHG mode 1201, resulting in significant improvement of the PLL settling time at the cost of worst noise performance. In fact, the noise performance becomes critical only in the final LG mode.

Another option particularly suitable for low voltage applications is to add a voltage doubler circuit that increases the voltage supply of the charge pump (CP), the loop filter and the OGs during the LHG mode. This enhances the tuning range of the PLL. A switch configuration enabling the isolation of the noisy voltage doubler during the LG mode is provided and a low noise output operating voltage supply is optionally added to save PLL spectrum purity.

The forgoing description has been presented for the purposes of illustration and description. It is not intended to be exhaustive or to limit the invention to the exemplary embodiments disclosed, and obviously many modifications and variations are possible in light of the above teaching. For example, the LHG mode can be implemented with a single input VCO, controlled by a single analog voltage without using any offset generator. The varactors 501 to 519 is controlled by the same signal. A circuit is added to change the threshold voltages of the varactors and thus to enable their capacitance to vary exactly as the curves $C_{01}$-$C_{19}$ of FIG. 8. The switching to the ZG mode is achieved by comparing the single control voltage to a plurality of reference voltages and decide for each varactor if it is set to its maximum value or to its minimum value.

In addition, further modifications and alternative embodiments of this invention will be apparent to those skilled in the art in view of this description. For example, the analogue self-calibrating method which uses a LHG mode to adjust the frequency and switches to a ZG mode to improve the noise performance, can be used in a successive approximation procedure. The PLL uses successive LHG mode/ZG mode stages; in each stage the specified gain of the LHG mode is lower than in the precedent stage. By this procedure the tuning converges successively toward the desired frequency. Therefore, it is to be understood that the forms of the invention herein shown and described are to be taken as exemplary embodiments. Various modifications and alternative embodiments can be used without departing from the scope of the present invention.

What is claimed is:

1. A method of operating a phase lock loop, the method comprising:
generating a control voltage based on both an output signal of a voltage-controlled oscillator and a reference signal;
selecting an operating mode from one of a high-gain mode, a zero-gain mode and a low-gain mode based on the control voltage;
operating the phase lock loop in the selected one of the high-gain mode, the zero-gain mode, and the low-gain mode;
offsetting the control voltage to generate an offset voltage based on the selected operating mode; and
generating the output signal based on the offset voltage.

2. The method of claim 1, further comprising:
switching an operating mode of the voltage-controlled oscillator to the high-gain mode to enable tuning of a frequency of the output signal to a first frequency within a frequency locking range; and
after locking the frequency of the output signal to the first frequency within the frequency locking range, switching the operating mode of the voltage-controlled oscillator to the zero-gain mode while maintaining the frequency of the output signal at the first frequency.

3. The method of claim 1, wherein offsetting the control voltage comprises offsetting the control voltage to generate the output signal based on a linear frequency versus voltage curve.

4. The method of claim 1, further comprising:
generating a tuning voltage based on the offset voltage; and
generating the output signal based on the tuning voltage.

5. The method of claim 1, further comprising:
offsetting the control voltage to generate a plurality of offset voltages;
comparing the plurality of offset voltages to a reference voltage to generate a plurality of tuning voltages; and
generating the output signal based on the plurality of tuning voltages.

6. The method of claim 1, further comprising:
generating a plurality of tuning voltages based on the control voltage; and
tuning N−1 of N elements of the phase lock loop during the high-gain mode based on the plurality of tuning voltages, where N is an integer greater than 1.

7. The method of claim 6, further comprising tuning one of the N elements of the phase lock loop based on a constant voltage.

8. The method of claim 1, further comprising:
generating a plurality of tuning voltages based on the control voltage; and
tuning N elements of the phase lock loop during the zero-gain mode based on the plurality of tuning voltages and a reference voltage, where N is an integer greater than 1.

9. The method of claim 8, further comprising tuning the N elements of the phase lock loop during the high-gain mode via the plurality of tuning voltages independent of the reference voltage.

10. The method of claim 1, further comprising:
generating a plurality of tuning voltages based on the control voltage;
tuning N−1 of N elements of the phase lock loop during the high-gain mode based on the plurality of tuning voltages, where N is an integer greater than 1; and
tuning one of the N elements of the phase lock loop via the control voltage independent of the plurality of tuning voltages.

11. A voltage-controlled oscillator circuit comprising:
a voltage-controlled oscillator configured to generate an output signal based on a first tuning voltage;
a detector configured to generate an error signal based on both the output signal and a reference signal;
a charge pump configured to generate a charge signal based on the error signal;
a loop filter configured to generate a control voltage based on the charge signal; and
a gain-mode switcher (i) configured to operate in each of a high-gain mode, a zero-gain mode, and a low-gain mode, and (ii) configured to offset the control voltage to generate the first tuning voltage based on selective operation in one of the high-gain mode, the zero-gain mode, and the low-gain mode.

12. The voltage-controlled oscillator circuit of claim 11, further comprising:
a first offset generator configured to offset the control voltage to generate a first offset voltage;
a second offset generator configured to offset the control voltage to generate a second offset voltage;
a first switch comparator configured to compare the first offset voltage to a reference voltage to generate the first tuning voltage; and
a second switch comparator configured to compare the second offset voltage to the reference voltage to generate a second tuning voltage,
wherein the voltage-controlled oscillator is configured to generate the output signal based on the first tuning voltage and the second tuning voltage.

13. The voltage-controlled oscillator circuit of claim 11, wherein:
the gain-mode switcher is configured to tune a first element of the voltage-controlled oscillator during the high-gain mode based on the first tuning voltage; and
the gain-mode switcher is configured to tune a second element of the voltage-controlled oscillator during the high-gain mode based on a direct current voltage.

14. The voltage-controlled oscillator circuit of claim 13, wherein:
the gain-mode switcher is configured to generate a second tuning voltage based on the control voltage, and
the gain-mode switcher is configured to tune a third element of the voltage-controlled oscillator during the high-gain mode based on the second tuning voltage.

15. The voltage-controlled oscillator circuit of claim 11, wherein:
the gain-mode switcher is configured to generate a second tuning voltage based on the control voltage, and
the gain mode switcher is (i) configured to tune a first element of the voltage-controlled oscillator based on both the first tuning voltage and a reference voltage during the zero-gain mode, and (ii) configured to tune a second element of the voltage-controlled oscillator based on both the second tuning voltage and the reference voltage.

16. The voltage-controlled oscillator circuit of claim 15, wherein the gain-mode switcher is configured to tune the first element and the second element during the high-gain mode based on respectively the first tuning voltage and the second tuning voltage and independent of the reference voltage.

17. The voltage-controlled oscillator circuit of claim 11, wherein:
 the gain-mode switcher is configured to generate a second tuning voltage based on the control voltage;
 a first element of the voltage-controlled oscillator is tuned during the low-gain mode based on the first tuning voltage; and
 a second element of the voltage-controlled oscillator is tuned during the high-gain mode based on the control voltage and independent of the first tuning voltage and the second tuning voltage.

* * * * *